United States Patent
Hong

(10) Patent No.: US 9,577,636 B1
(45) Date of Patent: Feb. 21, 2017

(54) SUBSTATE BIAS VOLTAGE GENERATION CIRCUITS AND METHODS TO CONTROL LEAKAGE IN SEMICONDUCTOR MEMORY DEVICE

(71) Applicant: SK hynix Inc., Icheon-si, Gyeonggi-do (KR)

(72) Inventor: Yun Seok Hong, Icheon-si Gyeonggi-do (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/051,081

(22) Filed: Feb. 23, 2016

(30) Foreign Application Priority Data

Oct. 15, 2015 (KR) ........................ 10-2015-0144072

(51) Int. Cl.
| H03K 19/00 | (2006.01) |
| H01L 21/761 | (2006.01) |
| G11C 7/22 | (2006.01) |
| G11C 5/14 | (2006.01) |
| G11C 29/12 | (2006.01) |
| G11C 7/20 | (2006.01) |

(52) U.S. Cl.
CPC ........... *H03K 19/0016* (2013.01); *G11C 5/146* (2013.01); *G11C 5/147* (2013.01); *G11C 7/20* (2013.01); *G11C 7/222* (2013.01); *G11C 29/12005* (2013.01); *H01L 21/761* (2013.01)

(58) Field of Classification Search
CPC ......... G11C 5/146; G11C 7/222; G11C 5/147; G11C 7/20; G11C 29/12005; H03K 19/0016; H01L 21/761
See application file for complete search history.

(56) References Cited

U.S. PATENT DOCUMENTS

| 2002/0044007 | A1* | 4/2002 | Mizuno | H03K 19/0016 327/534 |
| 2003/0016076 | A1* | 1/2003 | Mizuno | G11C 5/14 327/534 |
| 2003/0218494 | A1* | 11/2003 | Kubo | H01L 21/761 327/534 |
| 2005/0047247 | A1* | 3/2005 | Hatakeyama | H03K 19/0016 365/222 |
| 2007/0041252 | A1 | 2/2007 | Chu | |
| 2014/0307513 | A1* | 10/2014 | Chun | G11C 5/146 365/189.09 |

FOREIGN PATENT DOCUMENTS

KR 1020140100856 A 8/2014

* cited by examiner

*Primary Examiner* — Richard Elms
*Assistant Examiner* — Ajay Ojha
(74) *Attorney, Agent, or Firm* — William Park & Associates Ltd.

(57) ABSTRACT

A semiconductor device may be provided. The semiconductor device may include a first switching control signal generation circuit configured to generate a first switching control signal which is enabled in synchronization with a time when a first delay period has passed from a time when a power-down mode is entered. The semiconductor device may include a second switching control signal generation circuit configured to generate a second switching control signal which is enabled during a period from a time when a read operation mode or a write operation mode is entered to a time when a second delay period has passed.

25 Claims, 12 Drawing Sheets

SUBSTATE BIAS VOLTAGE GENERATION CIRCUITS AND METHODS TO CONTROL LEAKAGE IN SEMICONDUCTOR MEMORY DEVICE

CROSS-REFERENCE TO RELATED APPLICATION

The present application claims priority under 35 U.S.C. §119(a) to Korean Patent Application No. 10-2015-0144072, filed on Oct. 15, 2015, in the Korean Intellectual Property Office, which is incorporated herein by reference in its entirety.

BACKGROUND

1. Technical Field

Embodiments of the present disclosure generally relate to a semiconductor device, and more particularly, a semiconductor device capable of controlling a bulk voltage.

2. Related Art

An internal circuit included in a semiconductor device includes a plurality of PMOS transistors and a plurality of NMOS transistors. Bulks of the PMOS transistors and the NMOS transistors included in the semiconductor device are designed to be applied with bulk voltages. Bulk voltages are applied to prevent a latch-up phenomenon from occurring and threshold voltages of MOS transistors from unstably varying due to a body effect.

In general, levels of bulk voltages to be applied to PMOS transistors and NMOS transistors exert influences on leakage currents of the PMOS transistors and the NMOS transistors in turned-off states and on operation speeds of the PMOS transistors and the NMOS transistors in turned-on states. That is to say, in the case of an NMOS transistor, an amount of leakage current is decreased and an operation speed is increased as a bulk voltage of a level lower than a voltage of a source terminal is applied. Also, in the case of a PMOS transistor, an amount of leakage current is decreased and an operation speed is increased as a bulk voltage of a level higher than a voltage of a source terminal is applied.

A power-down mode is one of the standby modes of a semiconductor device. The power-down mode is an operation mode in which power is applied but generation of an internal clock is interrupted to reduce power consumption. In order to reduce power consumption in the power-down mode, it is important to limit an amount of leakage current to a minimum. Therefore, in order to reduce power consumption in the power-down mode, it is advantageous to set a bulk voltage of an NMOS transistor to be low and set a bulk voltage of a PMOS transistor to be high.

DETAILED DESCRIPTION

Various embodiments may be directed to a semiconductor device capable of controlling a level of a bulk voltage according to an operation mode.

In an embodiment, a semiconductor device may be provided. The semiconductor device may include a first switching control signal generation circuit configured to generate a first switching control signal which is enabled in synchronization with a time when a first delay period has passed from a time when a power-down mode is entered. The semiconductor device may include a second switching control signal generation circuit configured to generate a second switching control signal which is enabled during a period from a time when a read operation mode or a write operation mode is entered to a time when a second delay period has passed.

In an embodiment, a semiconductor device may be provided. The semiconductor device may include a first switching control signal generation circuit configured to generate a first switching control signal which is enabled during a period from a time when a read operation mode or a write operation mode is entered to a time when a first delay period has passed. The semiconductor device may include a first bulk voltage generation circuit configured to generate a first positive bulk voltage and a first negative bulk voltage in response to the first switching control signal.

In an embodiment, a semiconductor device may be provided. The semiconductor device may include a first switching control signal generation circuit configured to generate a first switching control signal in synchronization with a time when a first delay period has passed from a time when a power-down mode is entered. The semiconductor device may include a first bulk voltage generation circuit configured to control bulk voltages in response to the first switching control signal.

According to the embodiments, in the case of entering a power-down mode, by controlling a level of a bulk voltage after a preset period has passed, it may be possible to prevent current from being excessively consumed in controlling a level of the bulk voltage, even when entry to and exit from the power-down mode frequently occurs.

According to the embodiments, in the case of entering a read operation mode or a write operation mode, by retaining a state in which a level of the bulk voltage is controlled, for a predetermined period, it may be possible to prevent current from being excessively consumed in controlling a level of the bulk voltage, even when entry to and exit from the read operation mode or the write operation mode frequently occurs.

Hereinafter, a semiconductor device will be described below with reference to the accompanying drawings through various examples of embodiments.

Figure 1:
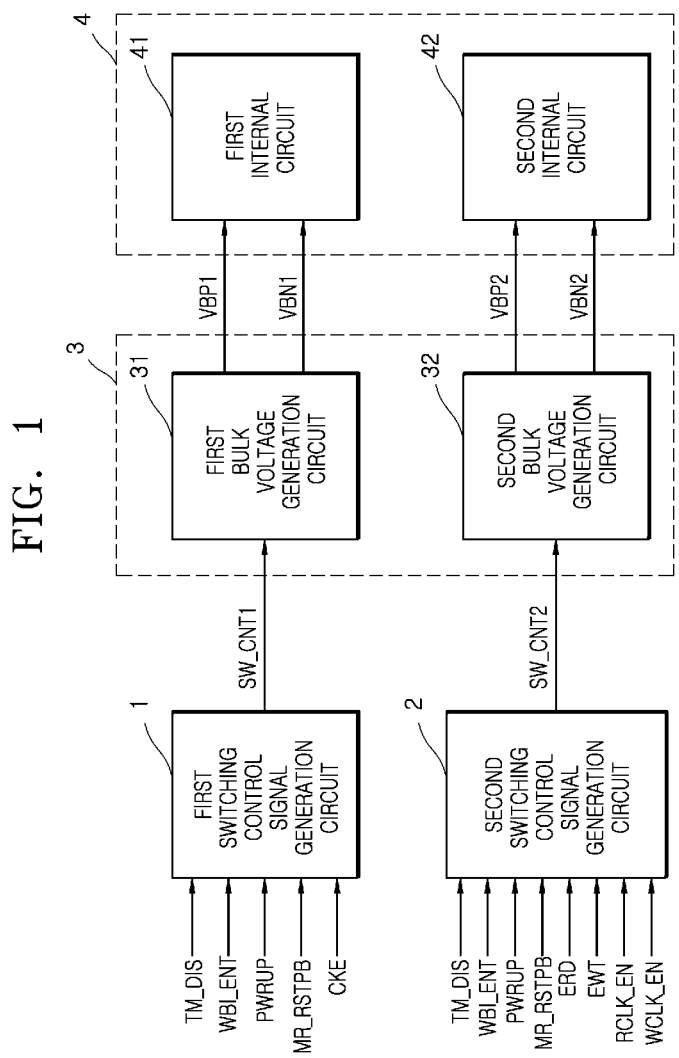
FIG. 1 is a block diagram illustrating a representation of an example of the configuration of a semiconductor device in accordance with an embodiment.

Referring to FIG. 1, a semiconductor device in accordance with an embodiment may include a first switching control signal generation circuit 1, a second switching control signal generation circuit 2, a bulk voltage generation circuit 3, and an internal circuit 4.

The first switching control signal generation circuit 1 may be inputted with a test end signal TM_DIS, a wafer test signal WBI_ENT, a power-up signal PWRUP, a reset signal MR_RSTPB and a clock enable signal CKE, and generate a first switching control signal SW_CNT1. The test end signal TM_DIS is a signal which is enabled to interrupt a test operation of controlling a bulk voltage. The wafer test signal WBI_ENT is a signal which is enabled to perform a wafer test. The power-up signal PWRUP is a signal of which logic level transitions after a period during which a power supply voltage rises to a target level (hereinafter, referred to as a 'power-up period') expires. The reset signal MR_RSTPB is a signal which is enabled to initialize an internal node. The clock enable signal CKE is a signal which is enabled in a period during which an internal clock is generated and is disabled in the case of entering a power-down mode. Logic levels at which the test end signal TM_DIS, the wafer test signal WBI_ENT, the power-up signal PWRUP, the reset signal MR_RSTPB and the clock enable signal CKE are enabled may be set variously according to embodiments. The first switching control signal generation circuit 1 may generate the first switching control signal SW_CNT1 which is enabled, in the case where the power-up period expires, the power-down mode is entered with the test end signal TM_DIS, the wafer test signal WBI_ENT and the reset signal MR_RSTPB disabled, and the clock enable signal CKE is disabled. The first switching control signal SW_CNT1 may be enabled in synchronization with a time when a preset period has passed from a time when the clock enable signal CKE is disabled.

The second switching control signal generation circuit 2 may be inputted with the test end signal TM_DIS, the wafer test signal WBI_ENT, the power-up signal PWRUP, the reset signal MR_RSTPB, a read signal ERD, a write signal EWT, a read operation signal RCLK_EN and a write operation signal WCLK_EN, and generate a second switching control signal SW_CNT2. The read signal ERD may include a pulse which is generated in synchronization with a read command inputted from an exterior to enter a read operation mode. The write signal EWT may include a pulse which is generated in synchronization with a write command inputted from an exterior to enter a write operation mode. The read operation signal RCLK_EN may be enabled during a period from a time when the read operation mode is entered to a time when a preselected period has passed after the read operation mode is exited. The write operation signal WCLK_EN may be enabled during a period from a time when the write operation mode is entered to a time when a preselected period has passed after the write operation mode is exited. The second switching control signal generation circuit 2 may generate the second switching control signal SW_CNT2 which is enabled, in the case where the read operation mode or the write operation mode is entered with the test end signal TM_DIS, the wafer test signal WBI_ENT and the reset signal MR_RSTPB disabled. The second switching control signal SW_CNT2 may be enabled during a period from a time when the read operation mode or the write operation mode is entered to a time when a predetermined period has passed. Logic levels at which the read signal ERD, the write signal EWT, the read operation signal RCLK_EN and the write operation signal WCLK_EN are enabled may be set variously according to embodiments.

The bulk voltage generation circuit 3 may include a first bulk voltage generation circuit 31 and a second bulk voltage generation circuit 32. The first bulk voltage generation circuit 31 may control driving of a first positive bulk voltage VBP1 and a first negative bulk voltage VBN1 in response to the first switching control signal SW_CNT1. For example, the first bulk voltage generation circuit 31 may drive the first positive bulk voltage VBP1 with a higher voltage and drive the first negative bulk voltage VBN1 with a lower voltage, in the case where the first switching control signal SW_CNT1 is enabled than in the case where the first switching control signal SW_CNT1 is disabled. The second bulk voltage generation circuit 32 may control driving of a second positive bulk voltage VBP2 and a second negative bulk voltage VBN2 in response to the second switching control signal SW_CNT2. For example, the second bulk voltage generation circuit 32 may drive the second positive bulk voltage VBP2 with a higher voltage and drive the second negative bulk voltage VBN2 with a lower voltage, in the case where the second switching control signal SW_CNT2 is enabled than in the case where the second switching control signal SW_CNT2 is disabled.

The internal circuit 4 may include a first internal circuit 41 and a second internal circuit 42. The first internal circuit 41 may be inputted with the first positive bulk voltage VBP1 and the first negative bulk voltage VBN1, and supply bulk voltages of MOS transistors included therein. For example, the first internal circuit 41 may supply the first positive bulk voltage VBP1 as a bulk voltage of PMOS transistors included therein, and supply the first negative bulk voltage VBN1 as a bulk voltage of NMOS transistors included therein. The second internal circuit 42 may be inputted with the second positive bulk voltage VBP2 and the second negative bulk voltage VBN2, and supply bulk voltages of MOS transistors included therein. For example, the second internal circuit 42 may supply the second positive bulk voltage VBP2 as a bulk voltage of PMOS transistors included therein, and supply the second negative bulk voltage VBN2 as a bulk voltage of NMOS transistors included therein. The internal circuit 4 may be realized as a circuit for various internal operations of the semiconductor device. For example, the first internal circuit 41 and the second internal circuit 42 may be realized as circuits included in one region of a core region where semiconductor memory cells are positioned and a peripheral region which is positioned at a periphery of the semiconductor memory cells. Banks and blocks for identifying the semiconductor memory cells may be included in the core region. The first internal circuit 41 and the second internal circuit 42 may be realized as any circuits including PMOS transistors and NMOS transistors, without being limited by functions.

Figure 2:
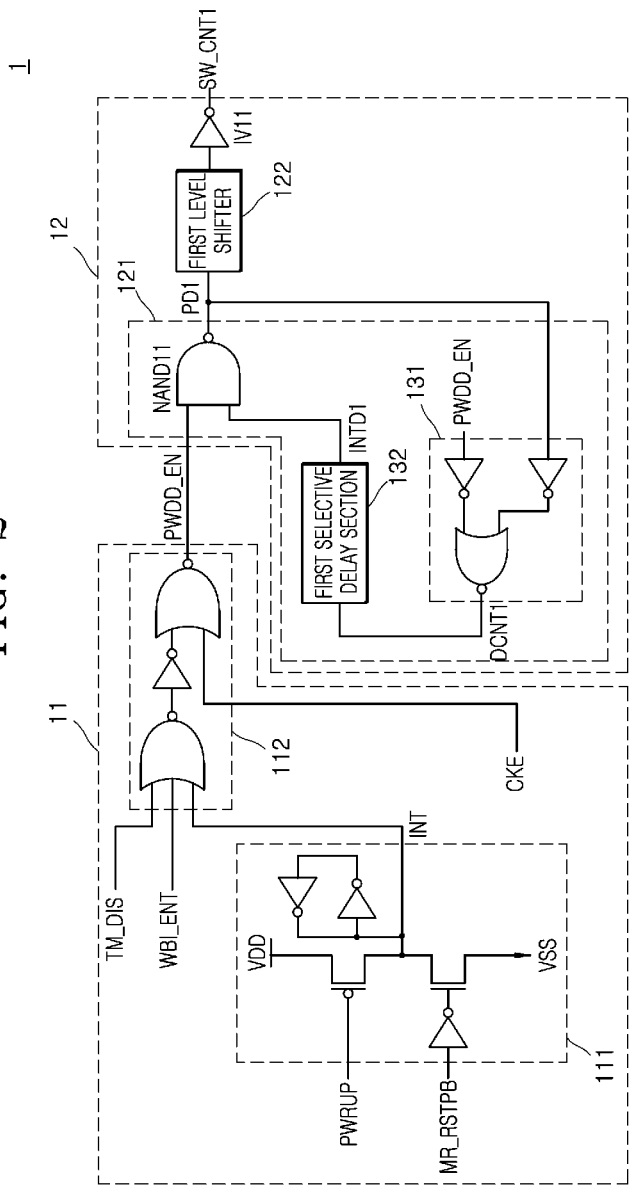
FIG. 2 is a diagram illustrating a representation of an example of the first switching control signal generation circuit included in the semiconductor device illustrated in FIG. 1.

Referring to FIG. 2, the first switching control signal generation circuit 1 may include a first mode entry signal generation circuit 11 and a first control signal output circuit 12.

The first mode entry signal generation circuit 11 may include a first initial signal generation circuit 111 and a first command processing circuit 112. The first initial signal generation circuit 111 may generate an initial signal INT in response to the power-up signal PWRUP and the reset signal MR_RSTPB. The first initial signal generation circuit 111 may drive the initial signal INT to a logic high level by the power-up signal PWRUP of a logic low level during the power-up period. The first initial signal generation circuit 111 initializes the initial signal INT to a logic low level in the case where the reset signal MR_RSTPB of a logic low level is inputted. The first command processing circuit 112 may generate a first mode entry signal PWDD_EN in response to the test end signal TM_DIS, the wafer test signal WBI_ENT, the initial signal INT and the clock enable signal CKE. The first command processing circuit 112 may generate the first mode entry signal PWDD_EN which is enabled to a logic high level, in the case where the power-down mode is entered with all of the test end signal TM_DIS, the wafer test signal WBI_ENT and the initial signal INT having logic low levels and the clock enable signal CKE transitions from a logic high level to a logic low level.

The first control signal output circuit 12 may include a first period signal generation circuit 121, a first level shifter 122, and an inverter IV11. The first period signal generation circuit 121 may include a first delay control section 131, a first selective delay section 132, and a NAND gate NAND11. The first delay control section 131 may generate a first delay control signal DCNT1 in response to the first mode entry signal PWDD_EN and a first period signal PD1. For example, the first delay control section 131 may generate the first delay control signal DCNT1 of a logic low level in the case where at least one of the first mode entry signal PWDD_EN and the first period signal PD1 is a logic low level, and generate the first delay control signal DCNT1 of a logic high level in the case where both the first mode entry signal PWDD_EN and the first period signal PD1 are logic high levels. The first selective delay section 132 may generate a first delayed signal INTD1 in response to the first delay control signal DCNT1. For example, the first selective delay section 132 may generate the first delayed signal INTD1 of a logic low level in the case where the first delay control signal DCNT1 is the logic low level, and generate the first delayed signal INTD1 of a logic high level after a preset delay period has passed in the case where the first delay control signal DCNT1 is the logic high level. The NAND gate NAND11 may generate the first period signal PD1 in response to the first mode entry signal PWDD_EN and the first delayed signal INTD1. For example, the NAND gate NAND11 may generate the first period signal PD1 of the logic high level in the case where at least one of the first mode entry signal PWDD_EN and the first delayed signal INTD1 is the logic low level, and generate the first period signal PD1 of the logic low level in the case where both the first mode entry signal PWDD_EN and the first delayed signal INTD1 are the logic high levels. The first level shifter 122 may level-shift the first period signal PD1, and output a resultant signal. The inverter IV11 may invert and buffer the output signal of the first level shifter 122, and output the first switching control signal SW_CNT1.

The first switching control signal generation circuit 1 may generate the first switching control signal SW_CNT1 which is driven to a logic low level, before the power-down mode is entered. The first switching control signal generation circuit 1 may generate the first switching control signal SW_CNT1 which is driven to a logic high level, after the preset delay period has passed in the case of entering the power-down mode.

Figure 3:
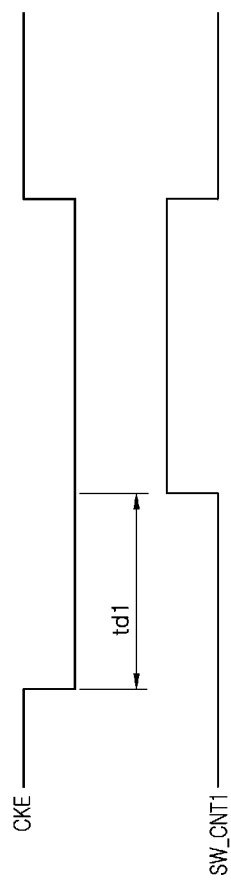
FIGS. 3 and 4 are representations of examples of timing diagrams to assist in the explanation of the operation of the first switching control signal generation circuit illustrated in FIG. 2.

Referring to FIG. 3, it may be seen that, in the first switching control signal generation circuit 1, in the case where the power-down mode is entered and the clock enable signal CKE transitions from the logic high level to the logic low level, the first switching control signal SW_CNT1 transitions to the logic high level at a time when a first delay period td1 has passed.

Figure 4:
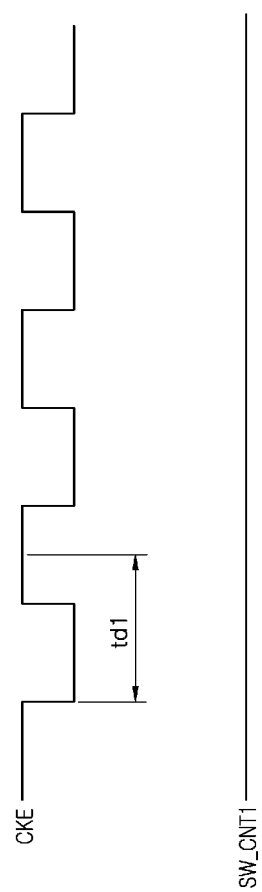

Referring to FIG. 4, it may be seen that, in the case where a period from an entry time to the power-down mode to an exit time from the power-down mode is set to be shorter than the first delay period td1, the first switching control signal SW_CNT1 retains the logic low level. In other words, in the semiconductor device in accordance with an embodiment, in the case where entry to and exit from the power-down mode frequently occur, in order to reduce current consumption, the first switching control signal SW_CNT1 is prevented from transitioning in its level.

Figure 5:
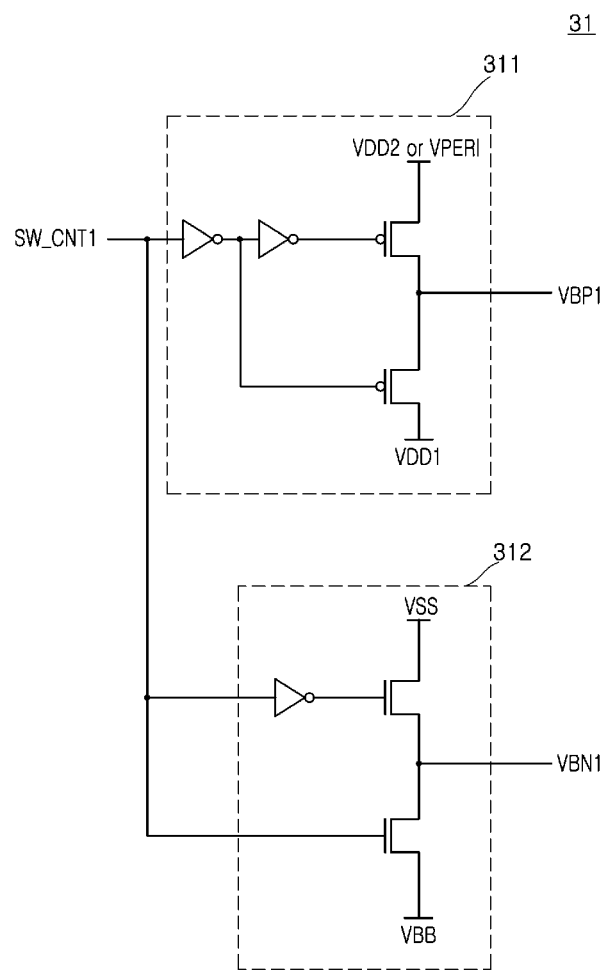
FIG. 5 is a diagram illustrating a representation of an example of the first bulk voltage generation circuit included in the semiconductor device illustrated in FIG. 1.

Referring to FIG. 5, the first bulk voltage generation circuit 31 may include a first voltage selection circuit 311 and a second voltage selection circuit 312.

The first voltage selection circuit 311 may drive the first positive bulk voltage VBP1 with one of a first power supply voltage VDD1, a second power supply voltage VDD2 and a first internal voltage VPERI in response to the first switching control signal SW_CNT1. For example, the first voltage selection circuit 311 may drive the first positive bulk voltage VBP1 with the first power supply voltage VDD1 in the case where the first switching control signal SW_CNT1 is the logic high level, and drive the first positive bulk voltage VBP1 with one of the second power supply voltage VDD2 and the first internal voltage VPERI in the case where the first switching control signal SW_CNT1 is the logic low level. The first power supply voltage VDD1 and the second power supply voltage VDD2 may be voltages which are supplied from an exterior, and the first internal voltage VPERI may be set as a voltage which is generated internally. The first power supply voltage VDD1 may be set to have a level higher than the second power supply voltage VDD2 and the first internal voltage VPERI.

The second voltage selection circuit 312 may drive the first negative bulk voltage VBN1 with one of a second internal voltage VBB and a ground voltage VSS in response to the first switching control signal SW_CNT1. For example, the second voltage selection circuit 312 may drive the first negative bulk voltage VBN1 with the second internal voltage VBB in the case where the first switching control signal SW_CNT1 is the logic high level, and drive the first negative bulk voltage VBN1 with the ground voltage VSS in the case where the first switching control signal SW_CNT1 is the logic low level. The ground voltage VSS may be a voltage which is supplied from an exterior, and the second internal voltage VBB may be set as a voltage which is generated internally. The second internal voltage VBB may be set to have a level lower than the ground voltage VSS.

Figure 6:
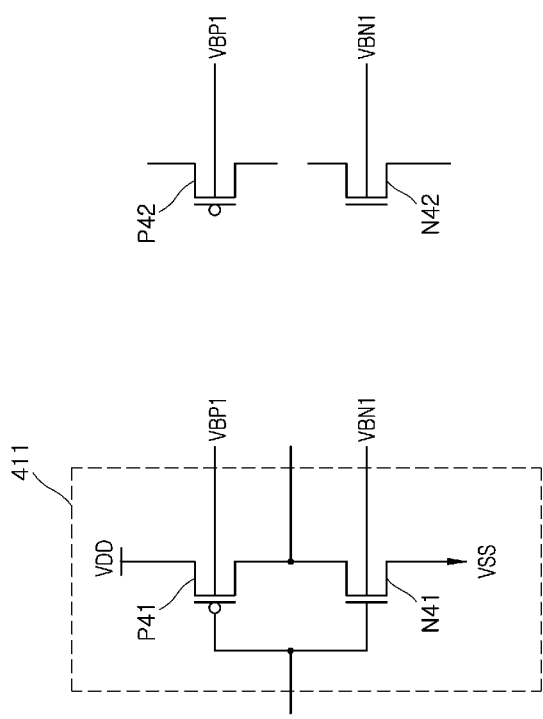
FIG. 6 is a circuit diagram illustrating a representation of an example of the first internal circuit included in the semiconductor device illustrated in FIG. 1.

Referring to FIG. 6, the first internal circuit 41 may include a first buffer 411, a PMOS transistor P42, and an NMOS transistor N42. The first buffer 411 may include a PMOS transistor P41 and an NMOS transistor N41.

The PMOS transistors P41 and P42 included in the first internal circuit 41 are supplied with the first positive bulk voltage VBP1. Since the first positive bulk voltage VBP1 is driven to a higher level in the case where the power-down mode is entered than before the power-down mode is entered, it is possible to reduce leakage current consumed through the PMOS transistors P41 and P42. In the case where entry to and exit from the power-down mode frequently occurs, since the first positive bulk voltage VBP1 is not changed in its level, it is possible to prevent occurrence of a phenomenon that current is unnecessarily consumed.

The NMOS transistors N41 and N42 included in the first internal circuit 41 are supplied with the first negative bulk voltage VBN1. Since the first negative bulk voltage VBN1 is driven to a lower level in the case where the power-down mode is entered than before the power-down mode is entered, it is possible to reduce leakage current consumed through the NMOS transistors N41 and N42. In the case where entry to and exit from the power-down mode frequently occur, since the first negative bulk voltage VBN1 is not changed in its level, it is possible to prevent occurrence of a phenomenon that current is unnecessarily consumed.

Figure 7:
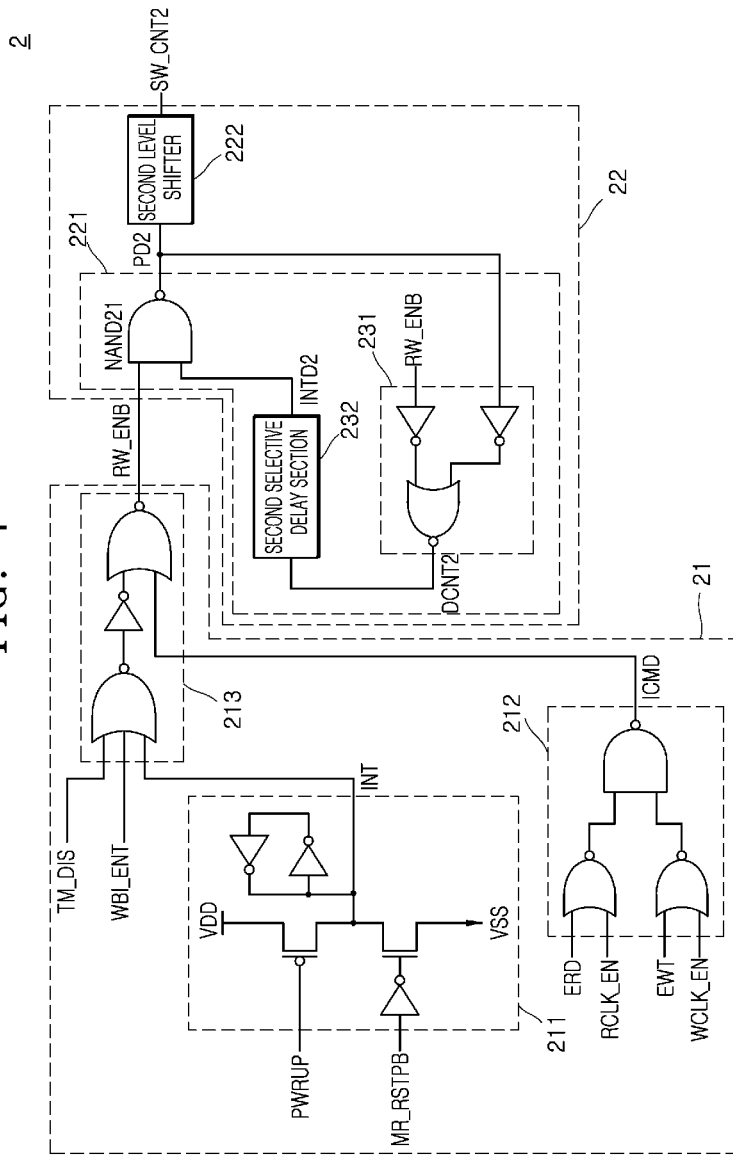
FIG. 7 is a diagram illustrating a representation of an example of the second switching control signal generation circuit included in the semiconductor device illustrated in FIG. 1.

Referring to FIG. 7, the second switching control signal generation circuit 2 may include a second mode entry signal generation circuit 21 and a second control signal output circuit 22.

The second mode entry signal generation circuit 21 may include a second initial signal generation circuit 211, an internal command generation circuit 212, and a second command processing circuit 213. The second initial signal generation circuit 211 may generate an initial signal INT in response to the power-up signal PWRUP and the reset signal MR_RSTPB. The second initial signal generation circuit 211 may drive the initial signal INT to the logic high level by the power-up signal PWRUP of the logic low level during the power-up period. The second initial signal generation circuit 211 initializes the initial signal INT to the logic low level in the case where the reset signal MR_RSTPB of the logic low level is inputted. The internal command generation circuit 212 may generate an internal command ICMD in response to the read signal ERD, the write signal EWT, the read operation signal RCLK_EN and the write operation signal WCLK_EN. In the case where a read operation is to be performed by the read signal ERD and the read operation signal RCLK_EN, the internal command generation circuit 212 may generate the internal command ICMD which is enabled to a logic high level, during a period from a time when the read operation mode is entered to a time when the preselected period has passed after the read operation mode is exited. In the case where a write operation is to be performed by the write signal EWT and the write operation signal WCLK_EN, the internal command generation circuit 212 may generate the internal command ICMD which is enabled to the logic high level, during a period from a time when the write operation mode is entered to a time when the preselected period has passed after the write operation mode is exited. The second command processing circuit 213 may generate a second mode entry signal RW_ENB in response to the test end signal TM_DIS, the wafer test signal WBI_ENT, the initial signal INT and the internal command ICMD. The second command processing circuit 213 may generate the second mode entry signal RW_ENB which is enabled to a logic low level, in the case where the read operation mode or the write operation mode is entered with all of the test end signal TM_DIS, the wafer test signal WBI_ENT and the initial signal INT having the logic low levels and the internal command ICMD transitions from a logic low level to the logic high level.

The second control signal output circuit 22 may include a second period signal generation circuit 221 and a second level shifter 222. The second period signal generation circuit 221 may include a second delay control section 231, a second selective delay section 232, and a NAND gate NAND21. The second delay control section 231 may generate a second delay control signal DCNT2 in response to the second mode entry signal RW_ENB and a second period signal PD2. For example, the second delay control section 231 may generate the second delay control signal DCNT2 of a logic low level in the case where at least one of the second mode entry signal RW_ENB and the second period signal PD2 is a logic low level, and generate the second delay control signal DCNT2 of a logic high level in the case where both the second mode entry signal RW_ENB and the second period signal PD2 are logic high levels. The second selective delay section 232 may generate a second delayed signal INTD2 in response to the second delay control signal DCNT2. For example, the second selective delay section 232 may generate the second delayed signal INTD2 of a logic low level in the case where the second delay control signal DCNT2 is the logic low level, and generate the second delayed signal INTD2 of a logic high level after a preset delay period has passed in the case where the second delay control signal DCNT2 is the logic high level. The NAND gate NAND21 may generate the second period signal PD2 in response to the second mode entry signal RW_ENB and the second delayed signal INTD2. For example, the NAND gate NAND21 may generate the second period signal PD2 of the logic high level in the case where at least one of the second mode entry signal RW_ENB and the second delayed signal INTD2 is the logic low level, and generate the second period signal PD2 of the logic low level in the case where both the second mode entry signal RW_ENB and the second delayed signal INTD2 are the logic high levels. The second level shifter 222 may level-shift the second period signal PD2, and output the second switching control signal SW_CNT2.

The second switching control signal generation circuit 2 may generate the second switching control signal SW_CNT2 which is driven to a logic low level, before the read operation mode or the write operation mode is entered. The second switching control signal generation circuit 2 may generate the second switching control signal SW_CNT2 which is driven to a logic high level, during a period from a time when the read operation mode or the write operation mode is entered to a time when a preset period has passed.

Figure 8:
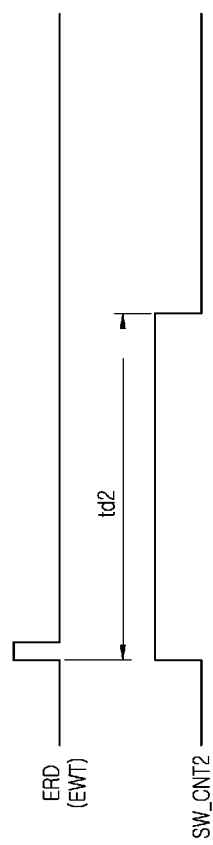
FIGS. 8 and 9 are representations of examples of timing diagrams to assist in the explanation of the operation of the second switching control signal generation circuit illustrated in FIG. 7.

Referring to FIG. 8, it may be seen that, in the second switching control signal generation circuit 2, the second switching control signal SW_CNT2 is enabled to the logic high level during a second delay period td2 from a time when the read signal ERD or the write signal EWT generates a pulse of a logic high level as the read operation mode or the write operation mode is entered.

Figure 9:
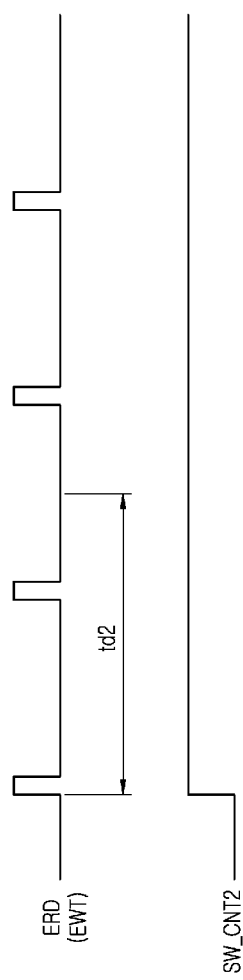

Referring to FIG. 9, it may be seen that, n the case where a period from an entry time to the read operation mode or the write operation mode to an exit time from the read operation mode or the write operation mode is set to be shorter than the second delay period td2, the second switching control signal SW_CNT2 retains the logic high level. In other words, in the semiconductor device in accordance with an embodiment, in the case where entry to and exit from the read operation mode or the write operation mode frequently occur, in order to reduce current consumption, the second switching control signal SW_CNT2 is prevented from transitioning in its level.

Figure 10:
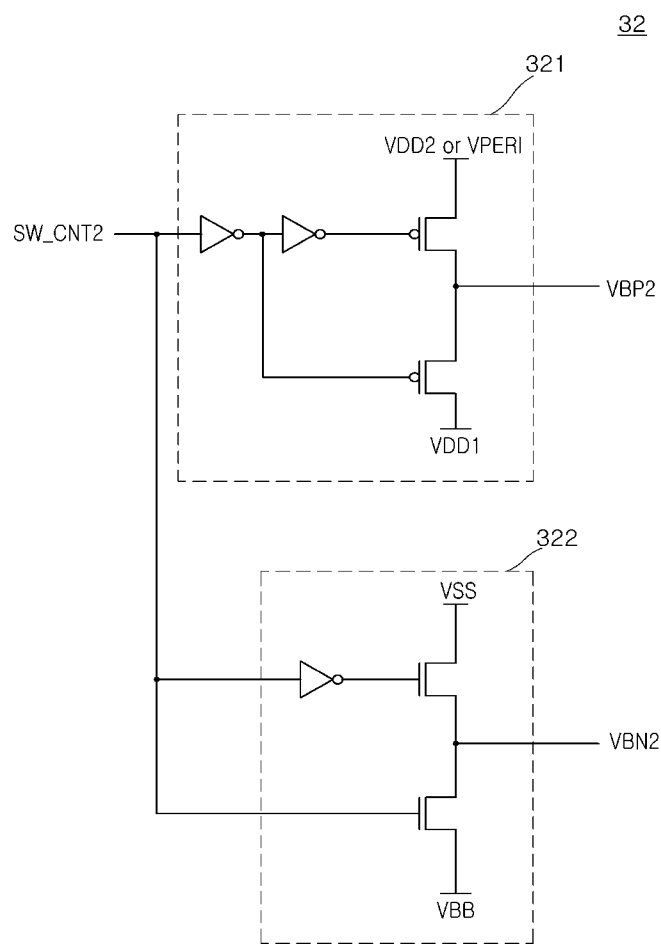
FIG. 10 is a diagram illustrating a representation of an example of the second bulk voltage generation circuit included in the semiconductor device illustrated in FIG. 1.

Referring to FIG. 10, the second bulk voltage generation circuit 32 may include a third voltage selection circuit 321 and a fourth voltage selection circuit 322.

The third voltage selection circuit 321 may drive the second positive bulk voltage VBP2 with one of the first power supply voltage VDD1, the second power supply voltage VDD2 and the first internal voltage VPERI in response to the second switching control signal SW_CNT2. For example, the third voltage selection circuit 321 may drive the second positive bulk voltage VBP2 with the first power supply voltage VDD1 in the case where the second switching control signal SW_CNT2 is the logic high level, and drive the second positive bulk voltage VBP2 with one of the second power supply voltage VDD2 and the first internal voltage VPERI in the case where the second switching control signal SW_CNT2 is the logic low level. The first power supply voltage VDD1 and the second power supply voltage VDD2 may be voltages which are supplied from an exterior, and the first internal voltage VPERI may be set as a voltage which is generated internally. The first power supply voltage VDD1 may be set to have a level higher than the second power supply voltage VDD2 and the first internal voltage VPERI.

The fourth voltage selection circuit 322 may drive the second negative bulk voltage VBN2 with one of the second internal voltage VBB and the ground voltage VSS in response to the second switching control signal SW_CNT2. For example, the fourth voltage selection circuit 322 may drive the second negative bulk voltage VBN2 with the second internal voltage VBB in the case where the second switching control signal SW_CNT2 is the logic high level, and drive the second negative bulk voltage VBN2 with the ground voltage VSS in the case where the second switching control signal SW_CNT2 is the logic low level. The ground voltage VSS may be a voltage which is supplied from an exterior, and the second internal voltage VBB may be set as a voltage which is generated internally. The second internal voltage VBB may be set to have a level lower than the ground voltage VSS.

Figure 11:
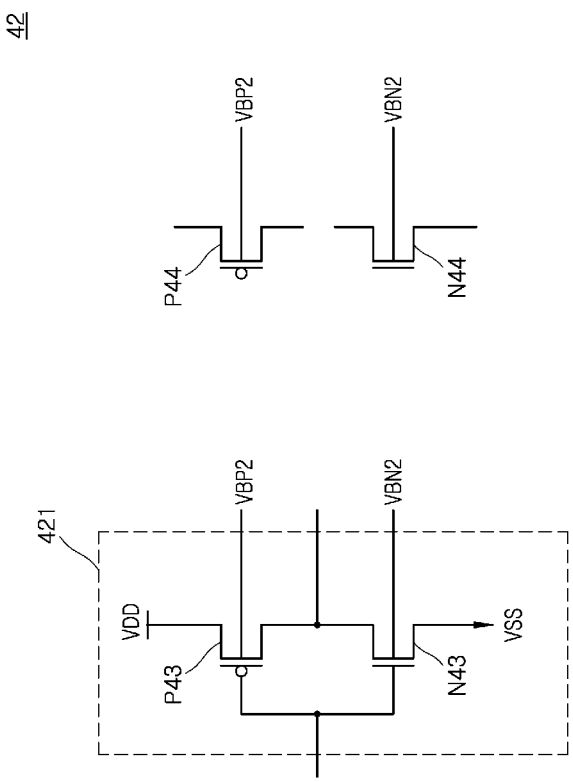
FIG. 11 is a circuit diagram illustrating a representation of an example of the second internal circuit included in the semiconductor device illustrated in FIG. 1.

Referring to FIG. 11, the second internal circuit 42 may include a second buffer 421, a PMOS transistor P44, and an NMOS transistor N44. The second buffer 421 may include a PMOS transistor P43 and an NMOS transistor N43.

The PMOS transistors P43 and P44 included in the second internal circuit 42 are supplied with the second positive bulk voltage VBP2. Since the second positive bulk voltage VBP2 is driven to a higher level in the case where the read operation mode or the write operation mode is entered than before the read operation mode or the write operation mode is entered, it is possible to reduce leakage current consumed through the PMOS transistors P43 and P44. In the case where entry to and exit from the read operation mode or the write operation mode frequently occurs, since the second positive bulk voltage VBP2 is not changed in its level, it is possible to prevent occurrence of a phenomenon that current is unnecessarily consumed.

The NMOS transistors N43 and N44 included in the second internal circuit 42 are supplied with the second negative bulk voltage VBN2. Since the second negative bulk voltage VBN2 is driven to a lower level in the case where the read operation mode or the write operation mode is entered than before the read operation mode or the write operation mode is entered, it is possible to reduce leakage current consumed through the NMOS transistors N43 and N44. In the case where entry to and exit from the read operation mode or the write operation mode frequently occur, since the second negative bulk voltage VBN2 is not changed in its level, it is possible to prevent occurrence of a phenomenon that current is unnecessarily consumed.

As is apparent from the above descriptions, in the semiconductor device according to the embodiments, in the case of entering one mode among a power-down mode, a read operation mode and a write operation mode, a level of a bulk voltage to be supplied to a PMOS transistor is increased, and a level of a bulk voltage to be supplied to an NMOS transistor is decreased, whereby leakage current may be reduced. In the semiconductor device according to the embodiments, by controlling a level of a bulk voltage after a preset delay period has passed from a time when the power-down mode is entered, it is possible to prevent unnecessary current consumption from being caused, even when entry to and exit from the power-down mode frequently occur. In the semiconductor device according to the embodiments, by retaining a state in which a level of a bulk voltage is controlled, during a period from a time when the read operation mode or the write operation mode is entered to a time when a predetermined delay period has passed, it is possible to prevent unnecessary current consumption from being caused, even when entry to and exit from the read operation mode or the write operation mode frequently occur.

Figure 12:
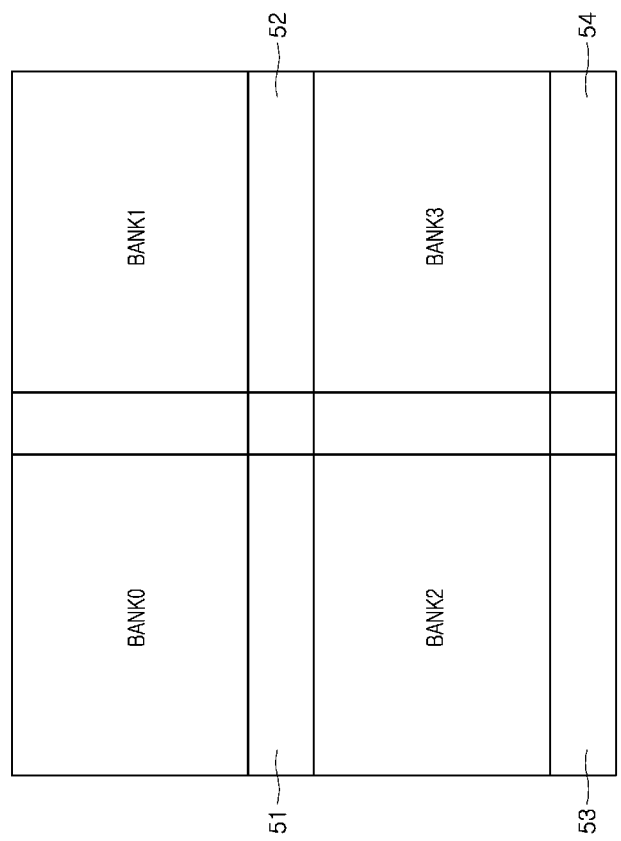
FIG. 12 is a diagram illustrating a representation of an example of the configuration of an integrated circuit to which the semiconductor device illustrated in FIGS. 1 to 11 is applied.

The semiconductor device described above with reference to FIGS. 1 to 11 may be applied to an integrated circuit which includes a plurality of banks. For example, referring to FIG. 12, an integrated circuit in accordance with an embodiment may include first to fourth banks BANK0, BANK1, BANK2 and BANK3 and first to fourth peripheral regions 51, 52, 53 and 54. A circuit for controlling the first bank BANK0 may be positioned in the first peripheral region 51. A circuit for controlling the second bank BANK1 may be positioned in the second peripheral region 52. A circuit for controlling the third bank BANK2 may be positioned in the third peripheral region 53. A circuit for controlling the fourth bank BANK3 may be positioned in the fourth peripheral region 54.

The semiconductor device described above with reference to FIGS. 1 to 11 may be provided for each of the banks BANK0, BANK1, BANK2 and BANK3 included in the integrated circuit. For example, a semiconductor device for controlling bulk voltages of MOS transistors included in the first bank BANK0 and the first peripheral region 51, a semiconductor device for controlling bulk voltages of MOS transistors included in the second bank BANK1 and the second peripheral region 52, a semiconductor device for controlling bulk voltages of MOS transistors included in the third bank BANK2 and the third peripheral region 53 and a semiconductor device for controlling bulk voltages of MOS transistors included in the fourth bank BANK3 and the fourth peripheral region 54 may be provided and operate separately.

While various embodiments have been described above, it will be understood to those skilled in the art that the embodiments described are by way of example only. Accordingly, the semiconductor device described herein should not be limited based on the described embodiments.

What is claimed is:
1. A semiconductor device comprising:
a first switching control signal generation circuit configured to generate a first switching control signal which is enabled in synchronization with a time when a first delay period has passed from a time when a power-down mode is entered; and
a second switching control signal generation circuit configured to generate a second switching control signal which is enabled during a period from a time when a read operation mode or a write operation mode is entered to a time when a second delay period has passed.

2. The semiconductor device according to claim 1, further comprising:
a first bulk voltage generation circuit configured to generate a first positive bulk voltage and a first negative bulk voltage in response to the first switching control signal.

3. The semiconductor device according to claim 2,
wherein the first positive bulk voltage is supplied as a bulk voltage of a PMOS transistor, and
wherein, when the first switching control signal is enabled, the first positive bulk voltage is driven to a higher level than a level of the first positive bulk voltage when the first switching control signal is disabled.

4. The semiconductor device according to claim 2,
wherein the first negative bulk voltage is supplied as a bulk voltage of an NMOS transistor, and
wherein, when the first switching control signal is enabled, the first negative bulk voltage is driven to a lower level than a level of the first negative bulk voltage when the first switching control signal is disabled.

5. The semiconductor device according to claim 1, further comprising:
a second bulk voltage generation circuit configured to generate a second positive bulk voltage and a second negative bulk voltage in response to the second switching control signal.

6. The semiconductor device according to claim 5,
wherein the second positive bulk voltage is supplied as a bulk voltage of a PMOS transistor, and
wherein the second positive bulk voltage is driven to a higher level when the second switching control signal is enabled, than a level of the second positive bulk voltage when the second switching control signal is disabled.

7. The semiconductor device according to claim 5,
wherein the second negative bulk voltage is supplied as a bulk voltage of an NMOS transistor, and
wherein the second negative bulk voltage is driven to a lower level when the second switching control signal is enabled, than a level of the second negative bulk voltage when the second switching control signal is disabled.

8. The semiconductor device according to claim 1, wherein the first switching control signal generation circuit comprises:
a mode entry signal generation circuit configured to generate a mode entry signal which is enabled when the power-down mode is entered; and
a control signal output circuit configured to generate the first switching control signal which is enabled in synchronization with a time when the first delay period has passed from a time when the mode entry signal is enabled.

9. The semiconductor device according to claim 8, wherein the mode entry signal generation circuit comprises:
an initial signal generation circuit configured to generate an initial signal in response to a power-up signal and a reset signal; and
a command processing circuit configured to generate the mode entry signal in response to a test end signal, a wafer test signal, the initial signal and a clock enable signal.

10. The semiconductor device according to claim 8, wherein the control signal output circuit comprises:
a period signal generation circuit configured to sense a level of a delay control signal which is set when the mode entry signal is enabled, and generate a period signal which is enabled from a time when the level of the delay control signal is sensed to a time when a preset delay period has passed.

11. The semiconductor device according to claim 10, wherein the control signal output circuit further comprises:
a level shifter configured to level-shift the period signal and output a resultant signal.

12. The semiconductor device according to claim 1, wherein the second switching control signal generation circuit comprises:
a mode entry signal generation circuit configured to generate a mode entry signal which is enabled when the read operation mode or the write operation mode is entered; and
a control signal output circuit configured to generate the second switching control signal which is enabled during a period from a time when the mode entry signal is enabled to a time when the second delay period has passed.

13. The semiconductor device according to claim 12, wherein the mode entry signal generation circuit comprises:
an internal command generation circuit configured to generate an internal command in response to a read signal, a read operation signal, a write signal and a write operation signal; and
a command processing circuit configured to generate the mode entry signal in response to the internal command.

14. The semiconductor device according to claim 12, wherein the control signal output circuit comprises:
a period signal generation circuit configured to generate a period signal which is enabled when the mode entry signal is enabled, wherein the control signal output circuit senses a level of a delay control signal which is set when the mode entry signal is enabled and disables the period signal from a time when the level of the delay control signal is sensed to a time when a preset delay period has passed.

15. The semiconductor device according to claim 1, wherein the first and second switching control signals control bulk voltages of MOS transistors included in one or more core regions and peripheral regions.

16. A semiconductor device comprising:
a first switching control signal generation circuit configured to generate a first switching control signal which is enabled during a period from a time when a read operation mode or a write operation mode is entered to a time when a first delay period has passed; and
a first bulk voltage generation circuit configured to generate a first positive bulk voltage and a first negative bulk voltage in response to the first switching control signal.

17. The semiconductor device according to claim 16,
wherein the first positive bulk voltage is supplied as a bulk voltage of a PMOS transistor, and
wherein, when the first switching control signal is enabled, the first positive bulk voltage is driven to a higher level than a level of the first positive bulk voltage when the first switching control signal is disabled.

18. The semiconductor device according to claim 16,
wherein the first negative bulk voltage is supplied as a bulk voltage of an NMOS transistor, and wherein, when the first switching control signal is enabled, the first negative bulk voltage is driven to a lower level than a level of the first negative bulk voltage when the first switching control signal is disabled.

19. The semiconductor device according to claim 16, wherein the first switching control signal generation circuit comprises:
   a mode entry signal generation circuit configured to generate a mode entry signal which is enabled when the read operation mode or the write operation mode is entered; and
   a control signal output circuit configured to generate the first switching control signal which is enabled during a period from a time when the mode entry signal is enabled to a time when the first delay period has passed.

20. The semiconductor device according to claim 19, wherein the mode entry signal generation circuit comprises:
   an internal command generation circuit configured to generate an internal command in response to a read signal, a read operation signal, a write signal and a write operation signal; and
   a command processing circuit configured to generate the mode entry signal in response to the internal command.

21. The semiconductor device according to claim 19, wherein the control signal output circuit comprises:
   a period signal generation circuit configured to generate a period signal which is enabled when the mode entry signal is enabled, wherein the control signal output circuit senses a level of a delay control signal which is set when the mode entry signal is enabled and disables the period signal from a time when the level of the delay control signal is sensed to a time when a preset delay period has passed.

22. The semiconductor device according to claim 16, wherein the first switching control signal controls bulk voltages of MOS transistors included in one or more core regions and peripheral regions.

23. The semiconductor device according to claim 16, further comprising:
   a second switching control signal generation circuit configured to generate a second switching control signal which is enabled in synchronization with a time when a second delay period has passed from a time when a power-down mode is entered.

24. The semiconductor device according to claim 23, further comprising:
   a second bulk voltage generation circuit configured to generate a second positive bulk voltage and a second negative bulk voltage in response to the second switching control signal.

25. The semiconductor device according to claim 24, wherein the second positive bulk voltage is supplied as a bulk voltage of a PMOS transistor, the second negative bulk voltage is supplied as a bulk voltage of an NMOS transistor, the second positive bulk voltage is driven to a higher level, when the second switching control signal is enabled, than a level of the second positive bulk voltage when the second switching control signal is disabled, and the second negative bulk voltage is driven to a lower level, when the second switching control signal is enabled, than a level of the second negative bulk voltage when the second switching control signal is disabled.

* * * * *

UNITED STATES PATENT AND TRADEMARK OFFICE
CERTIFICATE OF CORRECTION

| | |
|---|---|
| PATENT NO. | : 9,577,636 B1 |
| APPLICATION NO. | : 15/051081 |
| DATED | : February 21, 2017 |
| INVENTOR(S) | : Yun Seok Hong |

It is certified that error appears in the above-identified patent and that said Letters Patent is hereby corrected as shown below:

Item (54):
Change "SUBSTATE BIAS VOLTAGE GENERATION CIRCUITS AND METHODS TO CONTROL LEAKAGE IN SEMICONDUCTOR MEMORY DEVICE" to "SUBSTRATE BIAS VOLTAGE GENERATION CIRCUITS AND METHODS TO CONTROL LEAKAGE IN SEMICONDUCTOR MEMORY DEVICE"

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*